(12) United States Patent
Agarwal

(10) Patent No.: US 6,218,256 B1
(45) Date of Patent: *Apr. 17, 2001

(54) ELECTRODE AND CAPACITOR STRUCTURE FOR A SEMICONDUCTOR DEVICE AND ASSOCIATED METHODS OF MANUFACTURE

(75) Inventor: Vishnu K. Agarwal, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/291,127

(22) Filed: Apr. 13, 1999

(51) Int. Cl.$^7$ .................................................. H01L 21/20
(52) U.S. Cl. ........................ 438/393; 438/396; 361/305
(58) Field of Search ................................ 438/393, 381, 438/396, 399, 253, 612, 642, 657; 437/47, 52, 60, 238; 361/305, 313, 322, 330

(56) References Cited

U.S. PATENT DOCUMENTS

| | | | |
|---|---|---|---|
| 5,142,438 | 8/1992 | Reinberg et al. | 361/313 |
| 5,362,632 | * 11/1994 | Mathews | 437/47 |
| 5,405,796 | 4/1995 | Jones, Jr. | 437/47 |
| 5,409,855 | 4/1995 | Jun | 437/52 |
| 5,479,316 | 12/1995 | Smrtic et al. | 361/322 |
| 5,508,881 | * 4/1996 | Stevens | 361/305 |
| 5,576,071 | 11/1996 | Sandhu | 427/534 |
| 5,685,951 | 11/1997 | Torek et al. | 156/646.1 |
| 5,696,394 | 12/1997 | Jones, Jr. et al. | 257/295 |
| 5,741,712 | * 4/1998 | Stevens | 437/60 |
| 5,754,390 | 5/1998 | Sandhu et al. | 361/321.4 |
| 5,773,363 | 6/1998 | Derderian et al. | 438/672 |
| 6,010,940 | * 1/2000 | Lee et al. | 438/396 |

OTHER PUBLICATIONS

Y. Abe et.al., Surface Oxidation Behaviour of TiN Film Caused by Depositing SrTiO3 Film, Dec. 15, 1995, Jpn. J. Appl. Phs. vol. 34 (1995) Pt.2, No. 12B. Pp. L1678–1781.

US Patent Application Ser. No. 09/004,932, filed Jan. 09, 1998, of inventor DeBoer et. al., and assgined to Micron Technology, Inc., the same assignee of the present application.

* cited by examiner

*Primary Examiner*—David Nelms
*Assistant Examiner*—Phuc T. Dang
(74) *Attorney, Agent, or Firm*—Walter D. Fields

(57) ABSTRACT

An electrode and capacitor structure, and methods of manufacture thereof, are disclosed for a semiconductor device. The capacitor includes a dielectric layer sandwiched between opposing first and second electrically conductive electrodes. At least one of the electrodes includes a thin, oxygen-annealed, refractory metal nitride barrier layer disposed adjacent the dielectric. Preferabaly, the barrier comprises two thin layers of seperately oxygen-annealed, refractory metal nitride. In particular methods of manufacturing the electrode and capacitor structures, a single process chamber is used for both fabrication of the barrier layer(s) and deposition of overlying metalization for the electrode. The barrier layer, in one particular embodiment, is formed from precursor gases of titanium nitride and exposure to an oxidizing gas such as oxygen, ozone or nitrous oxide.

12 Claims, 5 Drawing Sheets

ELECTRODE AND CAPACITOR STRUCTURE FOR A SEMICONDUCTOR DEVICE AND ASSOCIATED METHODS OF MANUFACTURE

BACKGROUND OF INVENTION

The present invention relates to an electrode and associated capacitor structure for a semiconductor device, and more particularly to provision of a thin, oxygen-annealed, electrically conductive barrier layer adjacent a dielectric as part of the electrode.

A known capacitor includes two electrodes sandwiching a dielectric. A capacitance value of the capacitor characterizes an amount of charge that would be collected at the electrodes for a given applied voltage between the electrodes. This capacitance value is expressed by the equation $$C = \epsilon_r \epsilon_o A/d$$

wherein $\epsilon_r$=the relative dielectric constant of the dielectric between electrodes, $\epsilon_o$=the permittivity of free space, A=the surface area of the electrodes sandwiching the dielectric material, and d=the distance between the electrodes.

The capacitance value (C) of the capacitor is directly proportional to an area (A) of opposing surfaces of the electrodes, directly proportional to a relative dielectric constant ($\epsilon_r$) of the dielectric, and inversely proportional to the distance (d) between the electrodes.

An ideal capacitor, once charged by a given applied voltage, would hold its collected charge for an infinite duration—i.e., permitting no leakage current through the dielectric between the electrodes. Such ideal capacitor would also tolerate large voltage applications. However, it is known that certain physical limitations of real-world materials restrict the availability of such an ideal capacitor.

Known dielectrics exhibit voltage breakdown characteristics, wherein the influence of a sufficiently large electric field causes a breakdown within the dielectric material. Accordingly, for a given voltage application, a minimum distance or dielectric thickness is maintained between electrodes in order to avoid short-circuit failures by way of the dielectric's electric-field breakdown. Per the above equation, this requirement of a minimum distance between electrodes, therefore, limits the magnitude of the available capacitance value for a given electrode area Furthermore, the known dielectrics currently are not capable of blocking all current leakage, but instead have a finite conductivity (i.e., less than infinite resistance). Thus, a finite leakage current passes through the dielectric, which can deplete collected charge of the capacitor over a given period of time. As a result, when the capacitor is employed in a memory integrated circuit, e.g., a dynamic random access memory device, the capacitor requires a periodic refresh in order to restore the capacitor's charge before it is depleted. Preferably low, the refresh frequency for a memory device is governed by the charge retention capabilities of the capacitor and the amount of charge that it is able to collect—which parameters/qualities, in-turn, are proportional to capacitance value the capacitor and its applied voltage, respectively.

As inferred above, memory integrated circuits (e.g., a dynamic random access memory semiconductor devices) commonly employ capacitor elements. Manufacturers of these components continually push to shrink device geometries as a part of reducing manufacturing costs. However, given that the capacitance of a capacitor is directly proportional to the area of its electrode plates, a technical compromise exists between (i) the desire to reduce device geometry, and (ii) the need to maintain, or increase, charge retention of the capacitor for improving the performance of associated memory devices.

Embodiments of the present invention provide new electrode and capacitor structures, and methods of fabrication thereof, which overcome at least some of the above limitations and trade-offs.

SUMMARY OF THE INVENTION

In accordance with a first embodiment of the present invention, a capacitor structure comprises a dielectric layer sandwiched between first and second conductive layers. At least one of the first and second conductive layers includes a barrier portion formed to reduce migration of elements between the electrode and the dielectric. In accordance with one exemplary aspect of this embodiment, the barrier portion comprises oxygen-rich conductive material, and more preferably, oxygen-annealed refractory metal nitride adjacent the dielectric layer. More preferably, the refractory metal nitride of the barrier layer is of the group consisting of titanium nitride, tungsten nitride and tantalum nitride.

In accordance with one illustrative aspect of this first embodiment, the barrier layer comprises about 5 to 50 angstroms of oxygen annealed refractory metal nitride and the dielectric comprises tantalum pentoxide.

In accordance with a second embodiment of the present invention, an electrode structure overlays an oxide dielectric. The electrode structure comprises a layer of an oxygen-rich refractory metal nitride. Being oxygen-rich, the barrier layer is theorized to reduce migration of contaminants between the dielectric and the electrode. In accordance with one illustrative aspect of this second embodiment, the oxygen-annealed refractory metal nitride has a thickness of about 5 to 50 angstroms.

In accordance with a third embodiment of the present invention, a method of manufacturing a capacitor of a semiconductor device includes forming a first electrically conductive layer and a dielectric layer over a substrate. After forming the dielectric layer over the first electrically conductive layer, a thin layer of a conductive material is deposited over the dielectric. The thin layer of material is oxygen-annealed using an oxidizing gas of the group consisting of oxygen, ozone and nitrous oxide. Preferably, the oxygen-anneal is preformed in a process chamber which is the same as that used for depositing the barrier layer. In accordance with another aspect of this method of manufacturing, the oxygen-anneal comprises flowing oxidizing gases together with precursor gases of the conductive material during chemical vapor deposition thereof. In one exemplary embodiment, the conductive material comprises refractory metal nitride.

In a method of forming an electrode, in accordance with the present invention, a thin layer (e.g., 5 to 50 angstroms) of refractory metal nitride is provided over a dielectric and oxygen annealed. Preferably, the oxygen anneal is provided by exposing the refractory metal nitride to an oxidizing gas such as oxygen, ozone, or nitrous oxide.

BRIEF DESCRIPTION OF THE DRAWINGS

The present invention will be understood from reading the following description of particular embodiments, with reference to the attached drawings as listed below, where.

DETAILED DESCRIPTION OF THE PREFERRED EMBODIMENTS

Figure 1:
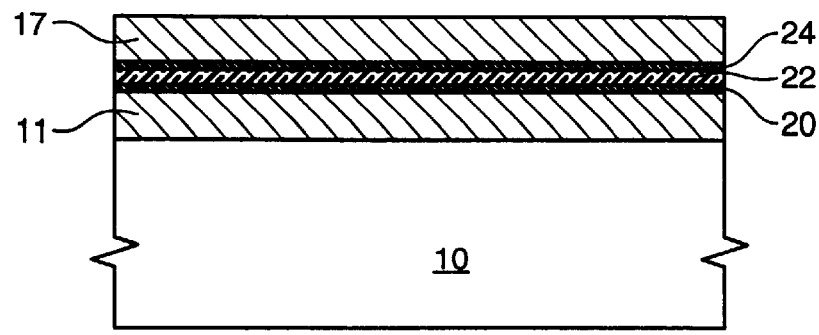
FIG. 1 is a partial cross sectional view of a known capacitor structure.
Figure 2:
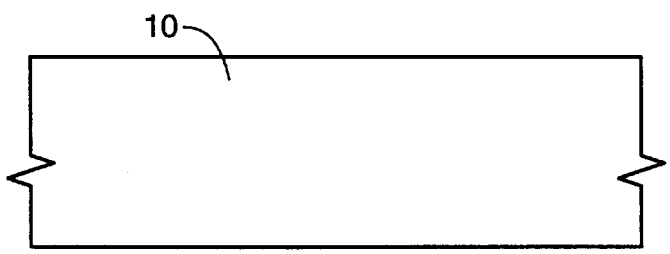
FIGS. 2–6 provide exemplary cross sectional views illustrating generally fabrication of a capacitor and an electrode in accordance with particular embodiments of the present invention.

A known capacitor structure, with reference to FIG. 1, includes first electrode 11 overlaying substrate 10. Three insulating layers of silicon oxide 20, silicon nitride 22 and silicon oxide 24 overlay electrode 11. These three oxide-nitride-oxide insulating layers are known as an ONO dielectric structure. Upper electrode 17 caps the ONO dielectric structure, completing the capacitor.

Silicon nitride, a common dielectric material for semiconductor capacitors, is typically preferred by the semiconductor industry over silicon oxide for capacitor dielectrics given its higher value dielectric constant. The nitride layer is made as thin as possible between the electrodes in order to obtain as high a capacitance value for the capacitor as will be permitted given its intended voltage application. However, if made too thin, the nitride layer will be prone to dielectric break down or punch-through, wherein insulating qualities of the dielectric deteriorate under the influence of an electric field, leaving short-circuit paths between the electrodes.

Additionally, "pin-holes" within the thin nitride layer might also contribute to current leakage between the electrodes. To seal these pin-holes, improve the dielectric integrity and reduce leakage between the electrodes, thin silicon oxide layers 20,24 (e.g., 5 angstroms) are provided on each side of the nitride layer. However, oxide layers 20,24, while improving charge retention capability for the capacitor, compromise the capacitance value of the capacitor given their contributed increase to the distance between the electrodes.

Another known dielectric material is tantalum pentoxide ($Ta_2O_5$). Having a dielectric constant greater than both silicon oxide and silicon nitride, tantalum pentoxide provides an opportunity for increased capacitance for a capacitor of given electrode areas and spacing. Additionally, because of its greater dielectric constant, tantalum pentoxide may enable fabrication of smaller geometry capacitors (without sacrifice in capacitance value) versus the geometry otherwise required for capacitors employing silicon oxide or silicon nitride dielectrics.

Similarly as described above for the silicon nitride dielectric, the thickness of the tantalum pentoxide layer is kept as thin as possible in order to optimize the capacitance value of a capacitor for a given voltage application without risk of dielectric breakdown or punch-through. After considering certain dielectric weaknesses, the present disclosure sets forth particular embodiments for an electrode and capacitor which seemingly preserve an integrity of associated dielectrics—thereby permitting use of thinner dielectrics and providing an opportunity for increased capacitance.

It is theorized that when an electrode, for example, comprising titanium nitride, is placed against a dielectric, e.g., of tantalum pentoxide, finite portions of material diffuse or migrate between the dielectric and the electrode, due to concentration gradients of elemental species therebetween. For example, oxygen may migrate from the dielectric into the electrode leaving behind "oxygen vacancies" within the dielectric. Likewise, material may diffuse or migrate from the electrode into the dielectric, providing contaminants within the dielectric. These vacancies and contaminants are thought to reduce the integrity of the dielectric layer, e.g., reducing its voltage breakdown threshold and its resistance to current leakage.

In accordance with an exemplary embodiment of the present invention a capacitor electrode includes a thin, oxygen annealed, refractory metal nitride layer disposed conformably against a dielectric. Such barrier, theoretically, is thought to establish a particular concentration gradient for the transition from the dielectric to the electrode so as to lessen migration of elements between the dielectric and the electrode. By reducing the migration of elements between the electrode and dielectric, the integrity of the dielectric layer is maintained, thereby improving the integrity of an associated capacitor.

With reference to FIGS. 2–6, substrate 10, comprises a semiconductor wafer, which may include, but not be limited to, doped or undoped silicon, silicon dioxide, glass, gallium arsenide or other similar semiconductor materials for the supporting substrate. In a preferred embodiment, substrate 10 is a partially processed semiconductor wafer of, for example, dynamic random access memory. Being partially processed, the substrate typically includes semiconductor structures such as trenches, transistor gates and conductive lines. Although FIGS. 2–6 do not show these features, it is understood that the scope of the present invention encompasses such exemplary structures on or within starting substrate 10.

Figure 3:
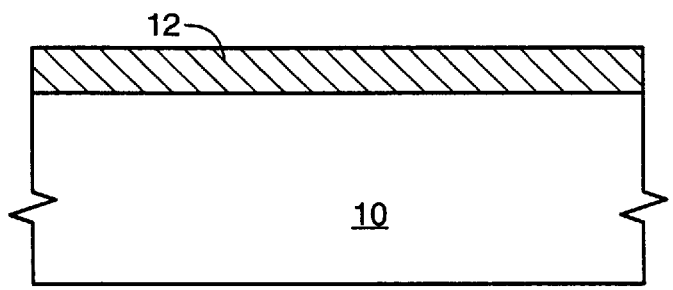

With reference to FIG. 3, electrically conductive layer 12 forms a first electrode that is layered conformably over substrate 10. In the preferred embodiment of the present invention, electrically conductive layer 12 comprises doped polycrystalline silicon. In alternative embodiments, electrically conductive layer 12 comprises a doped region of a silicon wafer, or a deposited metal layer of, for example, titanium, tungsten, chromium, platinum, ruthenium or iridium, or ruthenium-oxide or iridium-oxide or combinations thereof with or without silicon. Typically, conductive layer 12 includes a hemispherical grained (HSG) surface, not shown in FIGS. 2–6, which increases an effective area of an electrode associated with a capacitor. Such structure will be described more fully with reference to FIG. 7.

Figure 4:
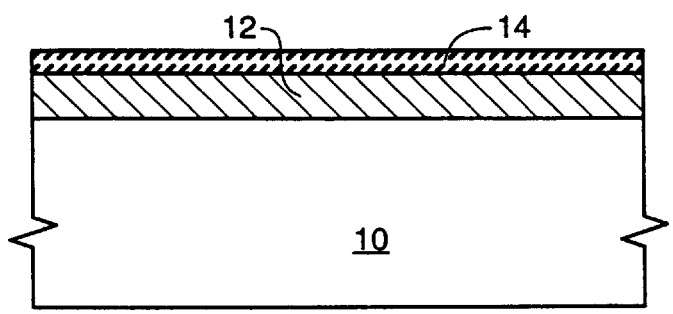
Figure 5:
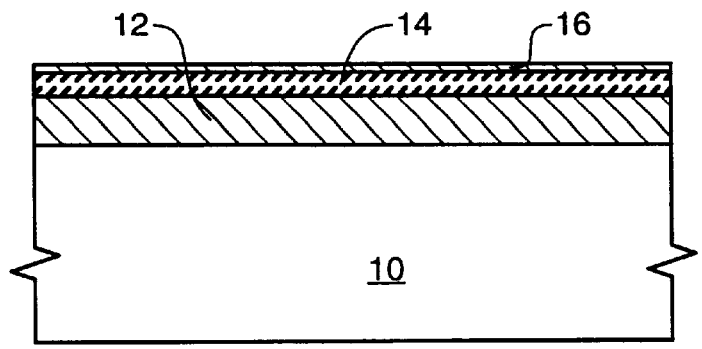

As shown in FIG. 4, dielectric 14 overlays electrode 12, and preferably comprises a refractory metal oxide of thickness less than 200 angstroms. More preferably, dielectric 14 comprises 30 to 100 angstroms of tantalum pentoxide ($Ta_2O_5$). In alternative high voltage embodiments, the thickness of dielectric 14 may be increased sufficiently to prevent dielectric breakdown or voltage punch-through under the influence of the electric fields associated with the higher voltage applications.

To complete the capacitor structure, a simple electrode could be layered over dielectric layer 14. However, pursuant the present disclosure, it is theorized that placement of known electrodes adjacent the tantalum pentoxide dielectric will effect, as mentioned hereinbefore, migration of oxygen from dielectric 14 into the electrode, and/or migration of residual elements of the electrode into the dielectric.

Regarding the residual electrode contaminants, to facilitate a better understanding of the theorized migration of these elements from the electrode to the dielectric, a brief description of the formation of a particular electrode is provided. One known electrode deposition procedure employs metal-organic, precursor compounds within a chemical vapor deposition process. The precursor compounds react to form an electrode layer over the substrate. Ideally, the precursor compounds react completely during the deposition, such that pure electrode material is formed over the substrate and undesirable by-products are vaporized and purged therefrom. However, existing organometalic chemical vapor deposition procedures provide electrodes that invariably include finite portions of residual by-product materials, such as, e.g. carbon, which residual by-product materials originate from and are left by the precursor chemistry. These residual by-products within known electrodes are theorized to migrate into neighboring dielectric 14, resulting in undesirable contaminants in the dielectric. As mentioned hereinbefore, these contaminants, taken together with the previously described oxygen vacancies, are believed by the inventor to be responsible for capacitor dielectric breakdown, and associated leakage effects.

To reduce the diffusion of elements between the dielectric and electrode, a thin, oxygen-annealed, electrically conductive, barrier layer 16 is provided over dielectric 14, as shown in FIG. 4. Preferably, barrier layer 16 comprises oxygen annealed, refractory metal nitride of less than 100 angstroms thickness. More preferably, barrier layer is between 5 to 50 angstroms, and in a specific illustrative embodiment, 10–20 angstroms (i.e., a few monolayers) thick.

As used in the present disclosure, and accompaning claims, the term "oxygen annealed" shall characterize a compound as having been annealed in an oxidizing atmosphere comprising an oxygen species such as, but not limited to, oxygen ($O_2$), ozone ($O_3$), and nitrous oxide ($N_2O$), with or without plasma enhancement.

In one particular exemplary embodiment of the present invention, the refractory metal nitride of the barrier layer comprises titanium nitride. In alternative embodiments, the refractory metal nitride comprises tantalum nitride or tungsten nitride. Oxygen annealing layer 16 is done to "oxygen saturate" the layer, wherein residual, free-atomic-bonding-sites of the refractory metal element, e.g., titanium, are bonded with oxygen to eliminate free-sites within layer 16, thereby reducing its attraction for oxygen from adjacent oxide dielectric 14. At a minimum, the oxygen-anneal establishes a concentration gradient profile for the transition from the dielectric to the electrode. Absent oxygen saturation of the barrier layer, oxygen from the dielectric might otherwise be attracted toward and diffuse into layer 16 or into overlying electrode layer 18, leaving vacancies within the dielectric. Additionally, the oxygen anneal is further theorized to help complete reaction of residual precursor elements within the refractory metal nitride layer, thereby removing accompanying contaminants, e.g., carbon, that might otherwise migrate as a contaminant into dielectric layer 14.

Figure 6A:
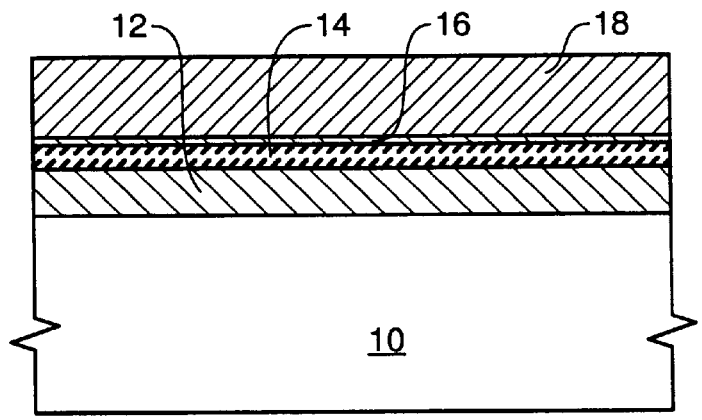

Electrically conductive layer 18 overlays the oxygen-annealed, refractory metal nitride, barrier layer 16, as shown in FIG. 6A. In the preferred embodiment of the present invention, conductive layer 18, comprises refractory metal that is the same as the refractory metal component (e.g., titanium nitride) of barrier layer 16. Alternatively, conductive layer 18 comprises material different from the refractory metal component of the barrier layer. For such alternative materials, conductive layer 18 comprises metals, such as, a metal nitride different from the metal nitride component of the barrier layer, aluminum, aluminum alloys, silicon, copper, platinum, ruthenium, iridium or gold or ruthenium-oxide or iridium-oxide or combinations thereof. The conductive layer 18 forms the second electrode node of the resulting capacitor. In particular applications, electrodes 18,12 are wired electrically in series within an electrical circuit of an integrated circuit. These nodes accordingly enable coupling of the capacitor element into an electrical circuit.

Preferably barrier layer 16 is electrically conductive and considered a sublayer of the overall electrode structure. The barrier layer interfaces the electrode-to the dielectric directly adjacent dielectric 14, e.g., tantalum pentoxide. As mentioned hereinbefore, with reference to the oxide layers of the ONO dielectric structure of a known silicon nitride capacitor, because the oxide layers are primarily electrically insulating, they increase the effective dielectric distance between the capacitor electrodes in proportion to their thickness. This increased distance compromises the capacitance value of the capacitor. In contrast, a barrier layer in accordance with one preferred exemplary embodiment of the present invention is electrically conductive, and does not add a dielectric distance penalty between electrodes.

As used within the disclosure of the present invention, the descriptive term "electrically conductive" characterizes an electrical conductivity of the barrier layer relative the underlying dielectric. Ideally, the barrier layer has good electrical conductivity; however, it is understood that an oxygen anneal of a refractory metal nitride barrier layer will result in formation of some oxide molecules within the "metal nitride layer" so as to lower its electrical conductivity. Accordingly, the "annealed refractory metal nitride barrier" layer does not exhibit ideal electrical conductivity. Nonetheless, the oxygen-rich barrier layer, while serving as a diffusion barrier between the dielectric and the overlying electrode, typically provides electrical conductivity greater than that of the dielectric layer. In an illustrative exemplary embodiment, the oxygen-rich, metal nitride barrier layer has a resistivity less than 500,000 ($\mu\Omega$cm) and typically between 2,000–200,000 ($\mu\Omega$cm).

Figure 6B:
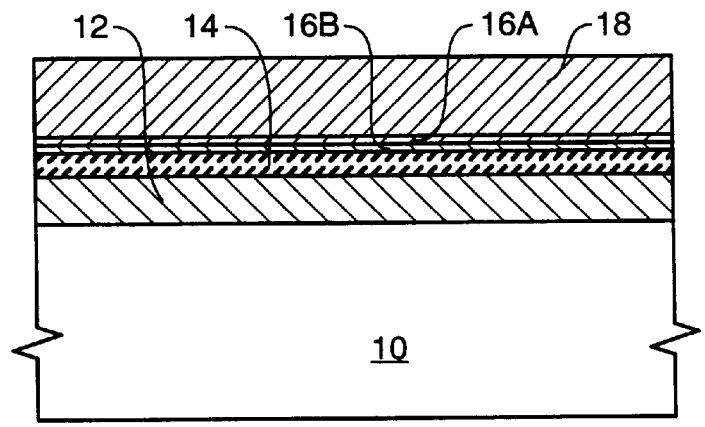

Thus far, the barrier layer has been described as a single layer of oxygen-annealed refractory metal nitride. In accordance with another or alternative exemplary embodiment of a capacitor, two separate, oxygen-annealed, refractory metal nitride layers are provided between electrode 18 and dielectric 14. With reference to FIG. 6B, first and second layers of oxygen-annealed refractory metal nitride 16A, 16B overlay one another over the top of dielectric layer 14. In providing the first layer, refractory metal nitride is thinly deposited, e.g. to a thickness less than 100 Å, and preferably between about 5–10 angstroms, over the dielectric and is oxygen annealed to drive residual contaminants out of the deposited metal nitride and to oxygen saturate the barrier. Oxygen saturation provides a given concentration gradient for the transition, as described hereinbefore, which is theorized to reduce migration of oxygen from the dielectric into the overlying electrode.

After annealing the first nitride layer 16A, a second layer of refractory metal nitride 16B is thinly deposited over the first oxygen-annealed refractory metal nitride layer 16A. The second layer of refractory metal nitride is also oxygen annealed and provided to a thickness similar to nitride layer 16A, preferably, about 5–10 angstroms. The two layer fabrication procedure provides barrier protection between the dielectric and the overlying electrode. Each layer being oxygen saturated, the two layers of the barrier structure establish a given concentration gradient (of elemental species) between the different dielectric and electrode layers that is theorized to reduce migration of oxygen and/or contaminants therebetween.

Figure 7:
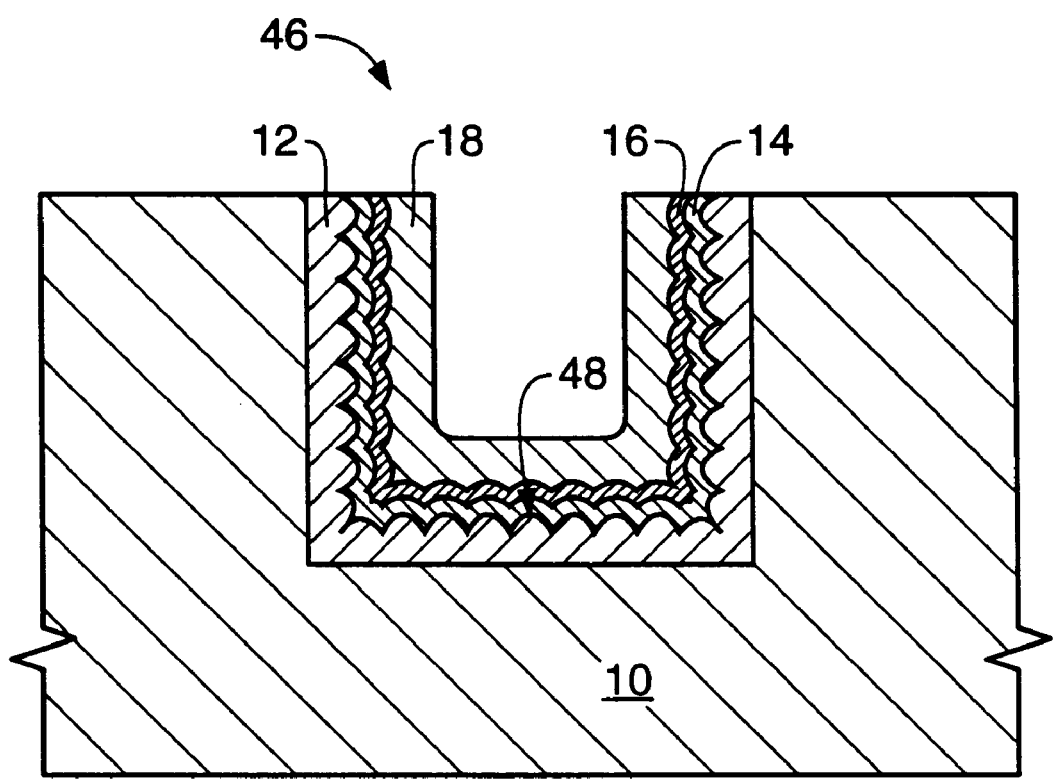
FIG. 7 is a partial cross-sectional view representation of a capacitor in accordance with an exemplary embodiment of the present invention.

Thus far, the capacitor structure of the present invention has been described with reference to the simplified, exemplary drawings of FIGS. 2–6. In accordance with a preferred embodiment of the present invention, the capacitor layers of the present invention are nested within a container structure, as illustrated by FIG. 7. Substrate 10 is processed using known techniques to form a pocket or container 46. Electrode 12 lines the walls of container 46 and is fabricated with known hemispherical grained (HSG) poly-silicon that provides a textured surface 48. Dielectric 14 is layered conformably over the textured surface 48 of electrode 12. Barrier 16 of the present invention is conformably disposed against dielectric 14, against a surface of the dielectric opposite underlying electrode 12. Exemplary procedures for the formation of and initial electrode layering of the pocket container within substrate 10 and formation of HSG polysilicon are described in U.S. Pat. application Ser. No. 08/076,324 entitled "Methods of Electrically Contacting the Conductive Plugs, Methods of Forming Contact Openings and Methods of Forming Dynamic Random Access Memory Circuitry", and U.S. Pat. Nos. 5,651,855, 5,670,404, 5,597, 763, and 5,378,654 which are hereby incorporated by reference.

Figure 8:
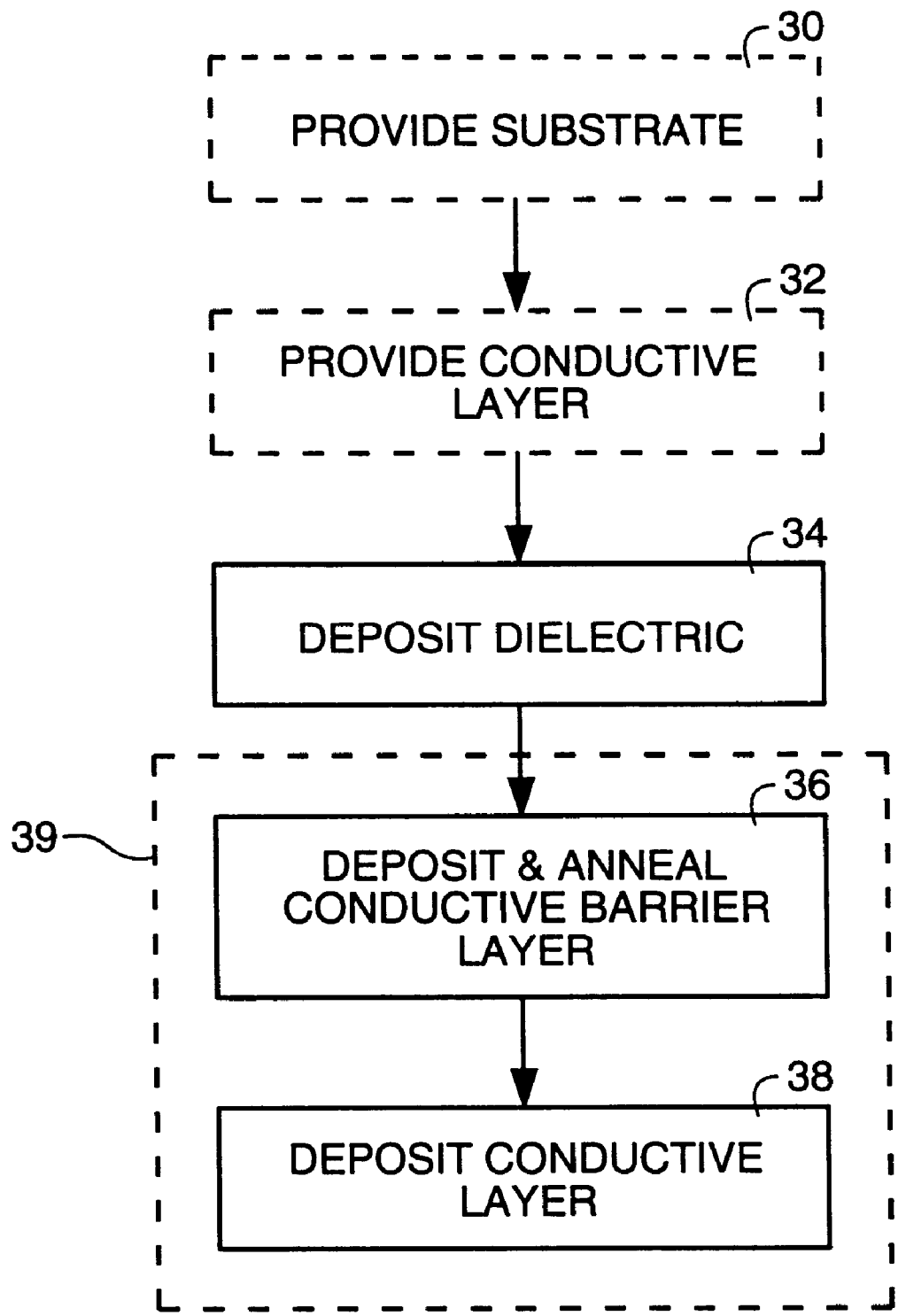
FIG. 8 is a flow chart representative of a method of fabricating an electrode and capacitor in accordance with exemplary embodiments of the present invention.
Figure 9:
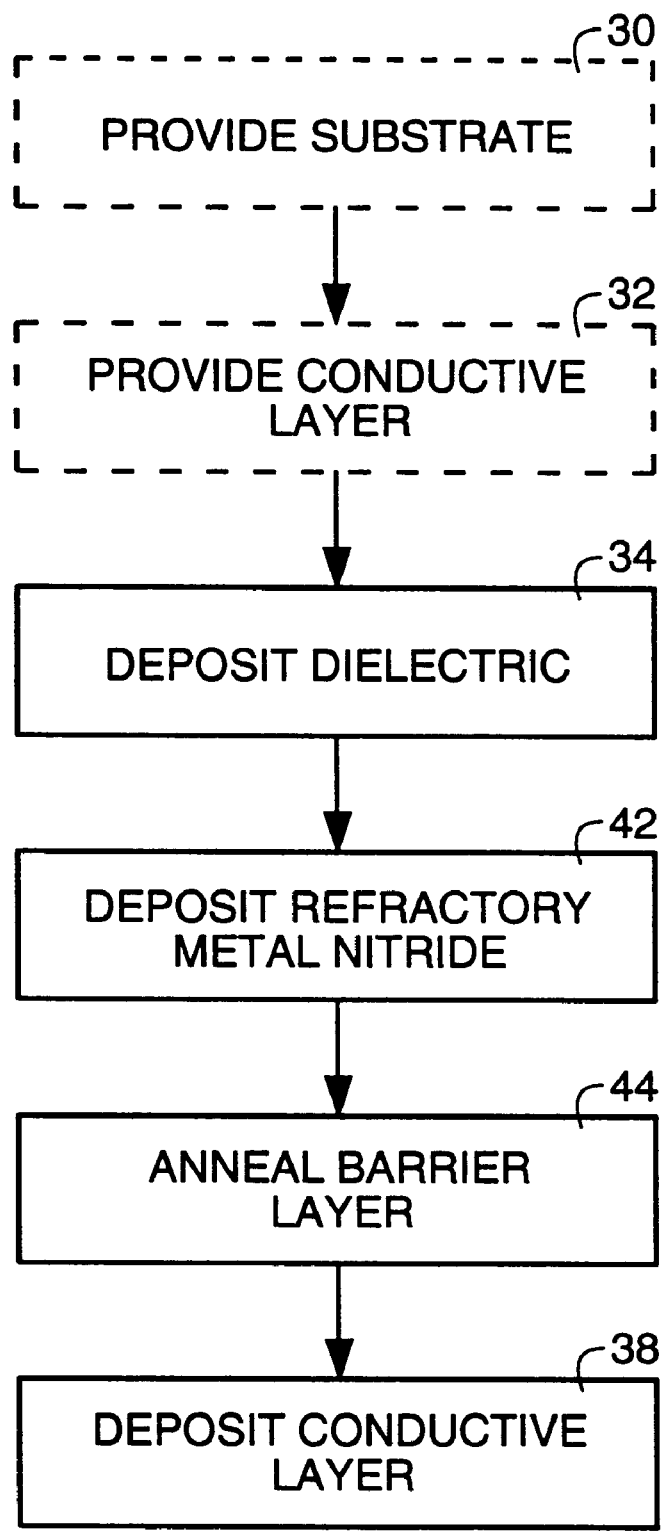
FIG. 9 is a flow diagram representative of alternative methods of the present invention for fabricating an electrode and capacitor.

Turning now to particular methods of fabricating the electrode and capacitor structures of the present invention, with reference to the flow charts of FIGS. 8 and 9, first, a conductive layer is deposited 30,32 over a substrate. The conductive layer 12, as was shown in FIG. 3, is formed using a known method such as, e.g., chemical vapor deposition (CVD), vacuum evaporation, or sputtering, of at least one of titanium, tungsten, silicon (typically polysilicon), chromium, platinum, ruthenium, iridium or hafnium or combinations thereof, over substrate 10. In accordance with an alternative aspect of this embodiment, conductive layer 12 is formed by doping a region within a semiconductor (e.g., silicon) wafer 10. More preferably, conductive layer 12 is formed using known HSG polysilicon layering procedure as described hereinbefore relative to FIG. 7.

Next, as shown by step 34 of FIGS. 8 & 9, a dielectric is deposited over the conductive layer. In a particular embodiment of the present invention, the dielectric layer (14 of FIG. 4) is deposited by chemical vapor deposition of tantalum pentoxide ($Ta_2O_5$). To provide this deposition, the substrate with conductive layer 12 is placed in a reaction vessel and exposed to precursors in an atmosphere comprising:

$Ta(OC_2H_5)_5$ [referred to as TAETO] at a flow of 0.01–2.0 ml/min;
$O_2$ at about 100–2000 sccm;
$N_2$ at about 100–3500 sccm;
0.01–1000 Torr; and
200–600° C. substrate temperature;

for a duration of about 10–900 seconds, for depositing about 30 to 100 angstroms of tantalum pentoxide ($Ta_2O_5$). Alternatively, the dielectric is deposited by another method such as sputtering, vacuum evaporation, vapor deposition or otherwise.

Preferably, the dielectric is then annealed in an oxidizing environment to crystallize or saturate it with oxygen.

Proceeding with an exemplary embodiment with reference to FIG. 9, after the step of depositing the dielectric, a thin layer of refractory metal nitride is deposited in step 42 over the dielectric. An exemplary recipe for depositing the thin layer of refractory metal nitride comprises placing the layered substrate, including the dielectric, in a deposition chamber of, for example, Applied Materials Precision 5000, and providing an atmosphere of:

5–50 sccm of $WF_6$;
100–2000 sccm of $N_2$;
100–1000 sccm of $H_2$;
100–2000 sccm of Ar;
0.01–20 Torr;
50–500 W power over the substrate (e.g., an eight inch diameter wafer); and
150–500° C. substrate temperature;

for a duration of about 5–100 seconds, for depositing less than 100 angstroms, and preferably between 5 to 50 angstroms of tungsten nitride ($WN_x$).

An alternative embodiment provides a thin layer of tungsten nitride ($WN_x$) by exposing the substrate to an atmosphere, for example, of:

5–100 sccm of $WF_6$;
20–500 sccm of $NH_3$;
optionally, 50–500 sccm $H_2$ and 100 1500 sccm of Ar;
0.1–200 Torr; and
300–680° C. substrate temperature;

for a duration of about 10–100 seconds, to deposit less than 100 angstroms, and preferably between about 5 to 50 angstroms of tungsten nitride ($WN_x$).

In accordance with another alternative exemplary embodiment of the present invention, a thin titanium nitride (TiN) layer is formed using an exemplary atmosphere of:

0.01–2 ml/min $TiCl_4$;
100–500 sccm of $NH_3$;
optionally, 50–500 sccm of $H_2$, 100–1000 sccm Ar, 100–1000 sccm $N_2$;
0.1–100 Torr; and
450–700° C. substrate temperature;

for a duration of about 10–100 seconds, to deposit less than 100 angstroms, and preferably between about 5 to 50 angstroms of titanium nitride (TiN).

In yet another alternative exemplary embodiment, a titanium nitride (TiN) layer is deposited in step 34 using an organometalic chemical vapor deposition procedure employing tetrakisdimethyl-aminotitanium (TDMAT) in the presence of a carrier gas using, for example, an atmosphere of:

0.01–5.0 ml/min of TDMAT;
20–1000 sccm of $N_2$;
30–1000 sccm of He;
0.1–10 Torr; and
300–500° C. substrate temperature;

for a duration of about 1–30 seconds, to deposit less than 100 angstroms, and preferably between about 5 to 50 angstroms of titanium nitride (TiN).

In accordance with each of the above embodiments of the present invention, the thin refractory metal nitride layer 16 (e.g., tungsten nitride, titanium nitride) is oxygen annealed. Preferably, with reference to FIG. 8, the oxygen anneal is provided in step 36, during deposition of the refractory metal nitride barrier layer; wherein, an oxidizing gas is incorporated into the chemical vapor deposition process during deposition of layer 16. Exemplary oxidizing gases include oxygen ($O_2$), ozone ($O_3$) and nitrous oxide ($N_2O$), with or without plasma excitation. In accordance with one aspect of this particular embodiment of the present invention, the oxidizing gas is introduced into the CVD procedure (associated with depositing the barrier layer) using a gas flow of about 100–600 sccm. Thereafter, oxygen flow is terminated during deposition of a remaining portion (18 in FIG. 6A) of the electrode. Preferably, the oxygen anneal "oxygen saturates" the barrier layer, eliminating open bonding-sites and purging possible precursor by-products therein.

In alternative embodiments of the present invention, the thin, refractory metal nitride layer 16 is oxygen annealed in a separate step, 44 of FIG. 9, independent the deposition thereof After depositing the thin layer of refractory metal nitride, the layer is exposed to a temperature of about 300–500° C. and to an atmosphere comprising an oxidizing gas of, for example, oxygen, ozone or nitrous oxide, at a flow of about 100–600 sccm, and a pressure of about 0.01–1 atm. To facilitate the anneal, a plasma excitation may be provided, employing, e.g., about 50–600 W RF energy at about 13.3 MHz frequency. Additionally, an inert gas such as argon, may be included to bombard the barrier layer and further facilitate the plasma anneal.

As noted before relative to FIG. 6B, in an alternative exemplary embodiment of the present invention, the barrier between the dielectric and electrode comprises two separately annealed refractory metal layers 16A and 16B. First and second thin layers of refractory metal, and preferably refractory metal nitride, e.g., titanium nitride, are deposited and annealed one over the other. In an exemplary embodiment, each layer is deposited with a thickness of less than 100 angstroms, and more preferably a thickness in the range of 5–10 angstroms. In a particular embodiment, the metal nitride layers are deposited using deposition recipes as described hereinbefore for titanium nitride. In accordance with a preferred aspect of this embodiment, the oxygen anneal of each layer is performed in-situ within the same chamber as that used during the respective refractory metal nitride depositions. Alternatively, the oxygen anneals are performed in a chamber different from that used for respective depositions.

After forming the thin, oxygen-annealed, barrier layer 16 over the dielectric 14, a conductive layer is deposited 38. Preferably, conductive layer 18 is deposited by an organometalic chemical vapor deposition to provide a layer of refractory metal nitride (e.g., titanium nitride) of the same type as that of refractory metal component of the barrier layer (e.g., the oxygen-annealed titanium nitride) with a thickness of about 50 to 500 angstroms. In alternative aspects of this embodiment, the conductive layer comprises a metal—e.g., a refractory metal, a refractory metal nitride, aluminum, aluminum alloy, silicon, copper, gold or combinations thereof—different from the metal component of the barrier layer. In these alternative embodiments, the metal is deposited by any suitable method such as sputtering, vacuum evaporation or vapor deposition.

In accordance with one aspect of a preferred embodiment of the present invention, the conductive layer is deposited (per steps 38,39) in a deposition chamber which is the same as that employed for depositing the barrier layer and formed from precursors similar to those used during deposition of the barrier layer. If provided a thickness of about 10 percent that of this overlying conductive layer 18 and being oxygen saturated, as mentioned hereinbefore, the barrier layer 16 is theorized to inhibit migration of oxygen from the dielectric 14 into the upper electrode and migration of residual elements of the electrode into the dielectric.

Thus, an exemplary embodiment provides an oxygen-annealed, oxygen-rich, refractory metal nitride barrier interface to an oxide dielectric so as to maintain an integrity thereof. Presumably, the barrier layer reduces dielectric pin-holes and reduces oxygen vacancies and contaminants therein.

Additionally, by employing an electrically conductive barrier layer at the electrode-dielectric interface, the integrity of the dielectric layer is maintained without addition, or penalty, of increased dielectric distance.

Furthermore, in accordance with the preferred embodiment of fabricating the barrier layer and electrode of the present invention, the step of forming the barrier layer and the step of forming the electrode employ a common deposition vessel, thereby reducing the number of steps that might otherwise be required for handling or transporting of product between different "barrier layer" and "conductive layer" deposition vessels.

Although the forgoing invention has been described in terms of certain preferred embodiments, other embodiments will become apparent, in view of the disclosure herein. For example, other embodiments might employ a dielectric—e.g., metal oxides, refractory metal oxides, or oxygen-inclusive calcogenides—different from the preferred tantalum pentoxide dielectric. Furthermore, the preferred embodiment provides a conductive layer over the barrier layer having a refractory metal nitride with a refractory metal that is of the same type as the refractory metal component of the barrier layer. However, it is understood that the conductive layer need not be limited to such similar type of material. Accordingly, the scope of the invention is, therefore, indicated by the independent claims rather than by the forgoing description. All changes thereto which come within the meaning and range of equivalency of the claims are to be embraced within the scope of the claims.

What is claimed is:

1. A method of manufacturing a capacitor of a semiconductor device, said method comprising:

providing a substrate;

forming a first electrically conductive layer on said substrate;

forming a dielectric layer over said first electrically conductive layer;

forming a barrier layer adjacent said dielectric layer, said barrier layer comprising refractory metal nitride; and depositing metal onto said barrier layer;

wherein said forming of the barrier layer comprises annealing refractory metal nitride and said annealing employs an oxidizing gas of the group consisting of oxygen, ozone and nitrous oxide.

2. A method of forming a barrier layer for an electrode over a dielectric, said method comprising:

providing a dielectric layer;

providing a conformal layer of refractory metal nitride of up to 50 angstroms on said dielectric layer; and annealing said refractory metal nitride;

wherein said annealing includes exposing said refractory metal nitride to an oxidizing gas and said oxidizing gas comprises ozone.

3. A method of forming a barrier layer for an electrode over a dielectric, said method comprising:

providing a dielectric layer;

providing a conformal layer of titanium nitride of up to 50 angstroms on said dielectric layer; and annealing said titanium nitride.

4. A method of forming a barrier layer for an electrode over a dielectric, said method comprising:
provided a dielectric layer;
providing a conformal layer of refractory metal nitride of up to 50 angstroms on said dielectric layer; and
annealing said refractory metal nitride, said annealing comprising exposing said refractory metal nitride to at least one of oxygen, ozone and nitrous oxide.

5. A method of forming a barrier layer for an electrode over a dielectric, said method comprising:
providing a dielectric layer;
providing a conformal layer of refractory metal nitride of up to 50 angstroms on said dielectric layer; and
annealing said refractory metal nitride, said annealing comprising providing said refractory metal nitride layer a temperature of at least 100° C.

6. A method of forming a barrier layer for an electrode over a dielectric, said method comprising:
providing a dielectric layer;
providing a conformal layer of refractory metal nitride of up to 50 angstroms on said dielectric layer;
annealing said refractory metal nitride;
depositing a second layer of refractory metal nitride of up to 50 angstroms over said annealed refractory metal nitride;
annealing said second layer of refractory metal nitride; and
depositing a refractory metal over said annealed second layer of refractory metal nitride.

7. A method of forming a capacitor, comprising the steps of:
forming a first electrode;
forming a dielectric layer proximate said first electrode;
forming a second electrode proximate said dielectric layer; and
forming a barrier region between said dielectric and at least one of said electrodes for reducing oxygen migration or diffusion into said at least one electrode;
said forming the barrier region comprising depositing, against said dielectric, conductive material of the group consisting of titanium, tantalum, tungsten, hafnium, ruthenium and iridium, and exposing said conductive material to an oxidizing gas.

8. A method of forming a capacitor, said method comprising:
forming a first electrode;
forming a dielectric layer proximate said first electrode;
forming a second electrode proximate said dielectric layer; and
forming a barrier region between said dielectric and at least one of said electrodes for reducing oxygen migration or diffusion into said at least one electrode;
said forming the barrier region comprising depositing conductive material against said dielectric, and exposing said conductive material to an oxidizing gas that comprises at least one of oxygen, ozone, and nitrous oxide.

9. A method of forming a capacitor, said method comprising:
forming a first electrode;
forming a dielectric layer proximate said first electrode;
forming a second electrode proximate said dielectric layer; and
forming a barrier region between said dielectric and at least one of said electrodes for reducing oxygen migration or diffusion into said at least one electrode;
said forming the barrier region comprising:
depositing refractory metal nitride employing chemical vapor deposition (CVD); and
exposing said refractory metal nitride to an oxidizing gas, said exposing comprising combining oxidizing gas together with precursor gases of refractory metal nitride during at least a portion of said chemical vapor deposition.

10. A method of forming a capacitor, said method comprising:
forming a first electrode;
forming a dielectric layer proximate said first electrode;
forming a second electrode proximate said dielectric layer; and
forming a barrier region between said dielectric and at least one of said electrodes for reducing oxygen migration or diffusion into said at least one electrode;
said forming the barrier region comprising:
chemical vapor depositing (CVD) conductive material over said dielectric, said chemical vapor depositing using precursors for said conductive material and also precursors for nitride and forming a nitride compound with said CVD deposited conductive material; and
exposing said conductive material to an oxidizing gas.

11. A method of forming a capacitor, said method comprising:
forming a first electrode;
forming a dielectric layer proximate said first electrode;
forming a second electrode proximate said dielectric layer; and
forming a barrier region between said dielectric and at least one of said electrodes for reducing oxygen migration or diffusion into said at least one electrode;
said forming the barrier region comprising:
chemical vapor depositing (CVD) conductive material over said dielectric, said CVD deposited conductive material comprising at least one of titanium, tantulum, tungsten, ruthenium and iridium; and
exposing said conductive material to an oxidizing gas.

12. A method according to claim 11, wherein said dielectric comprises tantalum pentoxide.

* * * * *